United States Patent
Müller

(10) Patent No.: US 10,201,107 B2
(45) Date of Patent: Feb. 5, 2019

(54) CABINET SYSTEM

(71) Applicant: RITTAL GMBH & CO. KG, Herborn (DE)

(72) Inventor: Matthias Müller, Dillenburg (DE)

(73) Assignee: Rittal GmbH & Co. Kg (DE)

( * ) Notice: Subject to any disclaimer, the term of this patent is extended or adjusted under 35 U.S.C. 154(b) by 0 days.

(21) Appl. No.: 15/500,054

(22) PCT Filed: Jun. 19, 2015

(86) PCT No.: PCT/DE2015/100246
§ 371 (c)(1),
(2) Date: Jan. 28, 2017

(87) PCT Pub. No.: WO2016/015708
PCT Pub. Date: Feb. 4, 2016

(65) Prior Publication Data
US 2017/0265320 A1    Sep. 14, 2017

(30) Foreign Application Priority Data

Aug. 1, 2014 (DE) .................. 10 2014 110 977
Aug. 19, 2014 (DE) .................. 10 2014 111 806

(51) Int. Cl.
*A47B 81/00* (2006.01)
*H05K 7/14* (2006.01)
*H02B 1/32* (2006.01)

(52) U.S. Cl.
CPC ................. *H05K 7/14* (2013.01); *H02B 1/32* (2013.01)

(58) Field of Classification Search
CPC .............................. A47B 88/43; H05K 7/183
(Continued)

(56) References Cited

U.S. PATENT DOCUMENTS 6,021,909 A * 2/2000 Tang .................. H02B 1/36
  211/183
6,052,274 A * 4/2000 Remsburg ............. F16B 19/109
  361/679.58
(Continued)

FOREIGN PATENT DOCUMENTS

DE    202004018376 U1    1/2005
EP         1061621 A1   12/2000
(Continued)

OTHER PUBLICATIONS

Rittal Catalogue (Handbuch) 34, Edition 2014/2015, p. 44 ff.
(Continued)

*Primary Examiner* — Matthew W Ing
(74) *Attorney, Agent, or Firm* — Harness, Dickey & Pierce, PLC

(57) ABSTRACT

A cabinet system including a cabinet housing and at least one component for interior fittings, which has a mounting section with a first end and a second end spaced apart from the first end. The component is installed and held on the cabinet housing with a form-fitting connection and under mechanical tension by a supporting section at the first end and a tensioning section at the second end. Mounts are on an interior of at least one of walls, a floor, and a ceiling of the cabinet housing. The mounts are in engagement with structures that are at least partially complementary and located on at least one of the first end and the second end of the component. The at least partially complementary structures are on the supporting section and on the tensioning section. The tensioning section includes a toggle lever having an attachment side and a tensioning side.

17 Claims, 8 Drawing Sheets

(58) Field of Classification Search
USPC .......................................... 312/334.4, 334.5
See application file for complete search history.

(56) References Cited

U.S. PATENT DOCUMENTS

| | | | |
|---|---|---|---|
| 6,863,188 B2* | 3/2005 | Besserer | A47B 88/43 211/175 |
| 8,721,012 B2* | 5/2014 | Chen | A47B 88/49 211/26 |
| 2002/0084734 A1* | 7/2002 | Shih | H02B 1/36 312/334.4 |
| 2002/0195408 A1* | 12/2002 | Hegrenes | H05K 7/183 211/26 |
| 2005/0156493 A1 | 7/2005 | Yang et al. | |
| 2006/0102575 A1 | 5/2006 | Mattlin et al. | |
| 2014/0252186 A1 | 9/2014 | Benner | |
| 2015/0201754 A1* | 7/2015 | Chen | A47B 96/025 248/219.3 |

FOREIGN PATENT DOCUMENTS

| | | |
|---|---|---|
| EP | 2330703 A2 | 6/2011 |
| WO | WO-2011041266 A1 | 4/2011 |
| WO | WO-2013075684 A1 | 5/2013 |

OTHER PUBLICATIONS

International Search Report (in English and German) dated Sep. 25, 2015 for PCT/DE2015/100246; ISA/EP.
Written Opinion (in German) dated Sep. 25, 2015 for PCT/DE2015/100246; ISA/EP.

* cited by examiner

CABINET SYSTEM

CROSS-REFERENCE TO RELATED APPLICATIONS

This application is a 371 U. S. National Stage of International Application No. PCT/DE2015/100246, filed on Jun. 19, 2015, which claims priority to German Application No. 10 2014 111 806.5 filed on Aug. 19, 2014 and German Application No. 10 2014 110 977.5, filed Aug. 1, 2014. The entire disclosures of the above applications are incorporated herein by reference.

FIELD

The disclosure relates to a cabinet system, having a cabinet housing into which at least one component for the interior fittings, having a mounting section that has a first end and a second end at a distance from the first, is installed or can be installed.

BACKGROUND

This section provides background information related to the present disclosure which is not necessarily prior art.

Such cabinet systems are known; an example is the compact control cabinet AE of the applicant, which is described in Rittal Handbook 34, Edition 2014/2015, p. 44 ff. A component for the interior fittings, in the form of a mounting rail, is the object of WO 2013/075684 A1. The mounting section described there has a tensioning section at a first end and a supporting section on a second end opposite the first end, wherein the tensioning section comprises a toggle lever. The toggle lever has an attachment side, by way of which the toggle lever is releasably screwed onto the first end of the mounting section, furthermore a tensioning side on which the mounting rail is fixed in place on a housing wall. For particularly effective fixation of the mounting rail on the inner sides of a cabinet housing, it is provided that both the supporting section and the tensioning section have at least one claw, which digs into the inner sides of the cabinet housing.

Proceeding from this state of the art, it is the task of the disclosure to make available a cabinet system in which dynamic loads can be absorbed in the interior fittings better than before.

SUMMARY

This section provides a general summary of the disclosure, and is not a comprehensive disclosure of its full scope or all of its features.

According to the disclosure, it is provided that geometric structures are affixed on the inner side of the walls, of the floor and/or of the ceiling of the cabinet housing, which structures are in engagement with structures that are complementary, a least in part, on at least one of the ends of the components that are spaced apart, wherein the component is held on the cabinet housing with a form-fitting connection and/or under mechanical tension. The geometrical structures and the structures complementary to them can reliably absorb dynamic loads, because the mounting rail is held in the cabinet housing at least by means of one form-fitting connection. Furthermore, the structures also serve as positioning aids for the components.

Mounting rails support rails, lights or electrical outlet strips, for example, are considered as components for the interior fittings. Although reference is primarily made to mounting rails below, it is understood that the explanations are also valid for other components for interior fittings.

It is preferred that the geometrical structures are affixed in a raster. Fundamentally, however, it is also possible to select different positioning with the most varied spacing, for example as a function of the size of the cabinet housing or of the size or dimensions of the respective component. Individual geometrical structures are also conceivable.

In this regard, the geometrical structures can be cams, imprints, mushroom heads, TOX points or other projections behind which engagement takes place. Other structures are possible, and cams having a hemispherical shape have proven to be particularly suitable.

According to a preferred embodiment of the disclosure, a supporting section is provided at the first end, and a tensioning section is provided at the second end, with the structures, which are at least partially complementary being provided both on the supporting section and on the tensioning section.

Preferably, the supporting section has a transition crosspiece that proceeds from the mounting section and has an attachment tab that is bent away from the latter and runs essentially perpendicular to the sides of the mounting section, with the complementary structures being affixed in the attachment tab.

Likewise preferably, the tensioning section of the mounting section comprises a toggle lever having an attachment side and a tensioning side, with the toggle lever being releasably screwed onto the mounting section on the attachment side. Furthermore, an edge section on which the toggle lever rests so as to pivot, can be provided at the second end of the mounting section.

The at least partially complementary structures can be configured in the tensioning side of the toggle lever.

The at least partially complementary structures can be perforations, according to a first embodiment of the disclosure, with a first number of perforations being provided in the attachment tab of the supporting section, and a second number of perforations being provided in the tensioning section of the component. Preferably, the number of perforations in the supporting section and in the tensioning section agree with one another. With such an embodiment, the component for the interior fittings is held in place both with a force-fitting connection and with a form-fitting connection.

According to a second embodiment of the disclosure, it is provided that the at least partially complementary structures are cutouts that are open toward the free edge of the attachment tab or toward the free edge of a bent region on the tensioning side of the toggle lever.

The component for the interior fittings of the cabinet system, particularly in the embodiment of a mounting rail or support rail, can furthermore be characterized in that a first section of the transition crosspiece has at least one oblong hole, which extends in the longitudinal direction of the mounting section.

In order to ensure varied installation possibilities, the sides of the mounting section can be provided with a perforation system, in the case of a mounting rail or support rail, which system can consist, in known manner, of rows of alternating circular openings and oblong holes that have a rectangular shape.

For stability reasons, it is advantageous if the mounting section is U-shaped in cross-section in the case of a mounting rail or support rail.

DRAWINGS

The drawings described herein are for illustrative purposes only of selected embodiments and not all possible implementations, and are not intended to limit the scope of the present disclosure.

Example embodiments will now be described more fully with reference to the accompanying drawings.

Figure 1:
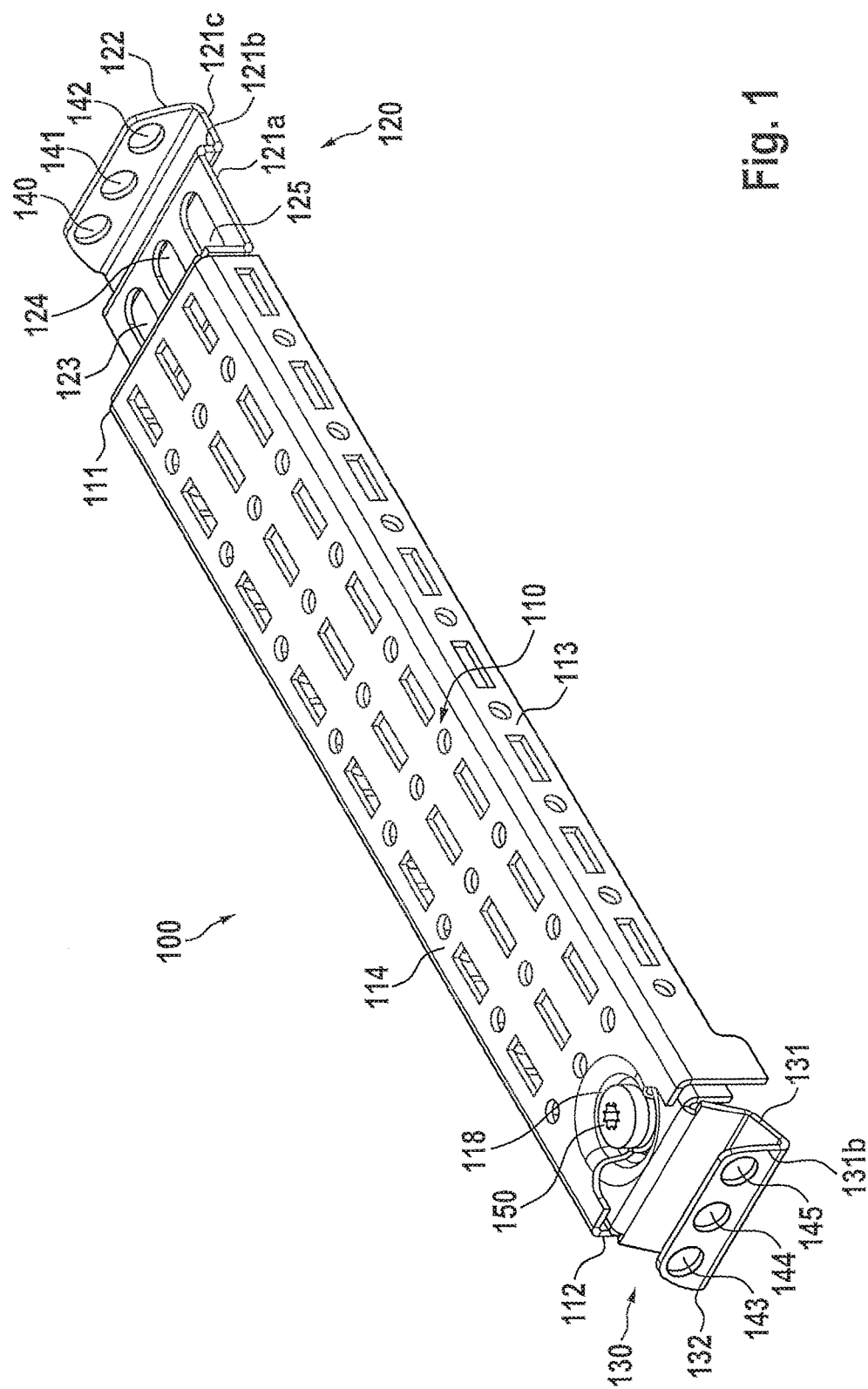
FIG. 1 shows a first embodiment of a mounting rail for use in a cabinet system according to the present disclosure.
Figure 2:
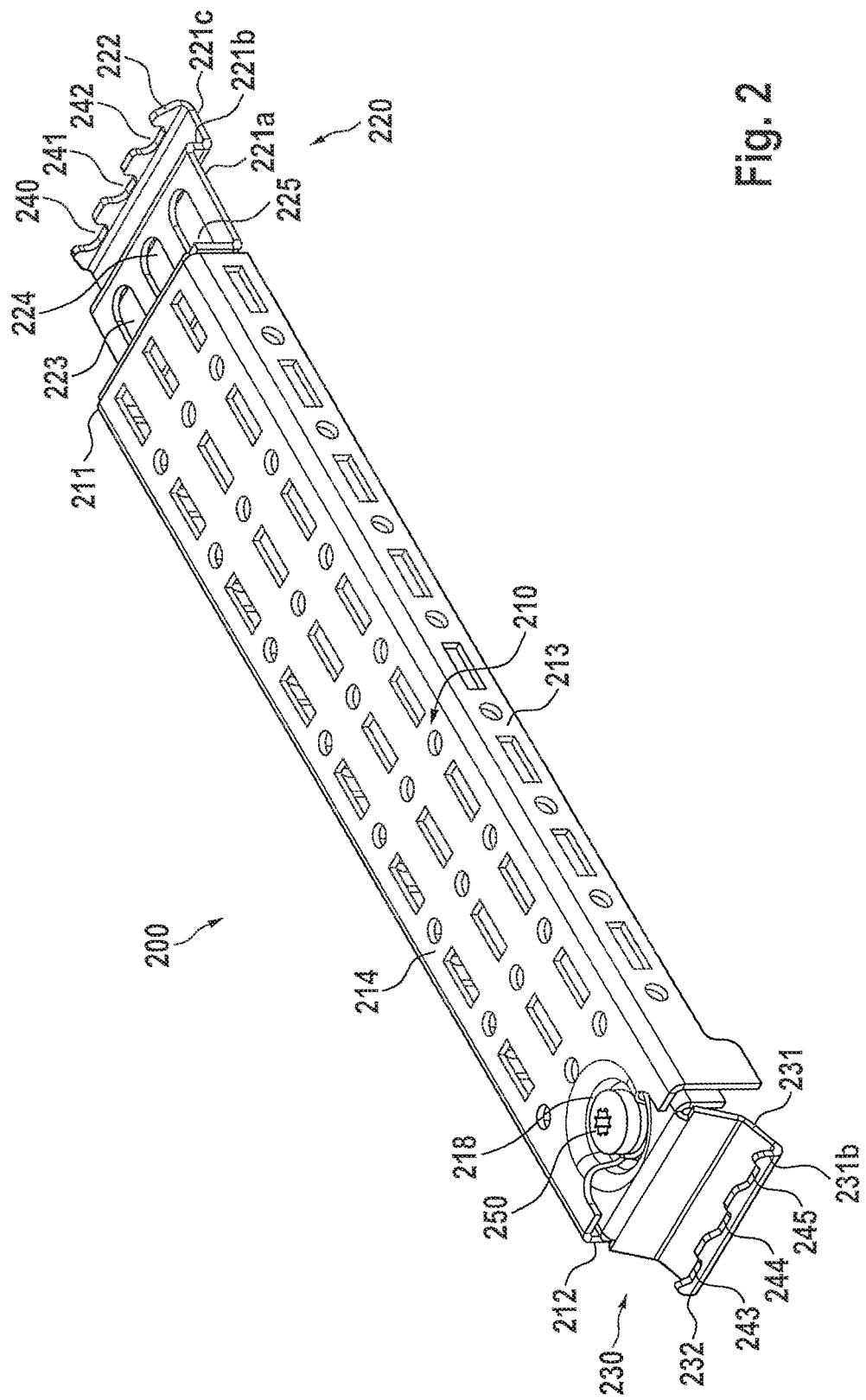
FIG. 2 shows a second embodiment of a mounting rail for use in a cabinet system according to the present disclosure.

FIGS. 1 and 2 show a perspective representation, in each instance, of a mounting rail 100, 200 according to a first and a second embodiment, for use in a cabinet system according to the present disclosure. The embodiments correspond to one another, to a great extent, with the differences being found in the configuration of the complementary structures, as will be explained below. In particular, all the further explanations that relate to FIG. 2 also apply to the embodiment according to FIG. 1.

In FIGS. 1 and 2, a mounting rail 100, 200 for a cabinet system according to the present disclosure comprises a mounting section 110, 210 having a first end 111, 211 and a second end 112, 212. A supporting section 120, 220, which consists of a transition crosspiece 121a, 121b, 121c or 221a, 221b, 221c, respectively, and an attachment tab 122, 222, is affixed at the first end 111, 211 of the mounting section 110, 210. In this regard, a first section 121a, 221a runs perpendicular to the side walls 113, 213 (and 215, FIG. 3) and parallel to the top side 114, 214 of the mounting section 110, 210. Three oblong holes 123, 124, 125 or 223, 224, 225, respectively, are introduced into this section 121a, 221a, which holes extend parallel to one another in the longitudinal direction of the mounting section 110, 210. The section 121a, 221a is followed, at a right angle, by a section 121b, 221b, which in turn makes a transition, at a right angle, into a section 121c, 221c, which runs parallel to the section 121a, 221a. Perpendicular to this section 121c, 221c, the attachment tab 122, 222 follows, which is provided with complementary structures 140, 141, 142 or 240, 241, 242, respectively. The tensioning section 130, 230 at the second end 112, 212 of the mounting section 110, 210 comprises a toggle lever 131, 231 having an attachment side (which can be better seen in FIG. 4) and a tensioning side 131b, 231b, which has a bent region 132, 232, with complementary structures 143, 144, 145 or 243, 244, 245, respectively, being affixed in the bent region 132, 232. The attachment side is releasably affixed on the mounting section 110, 210, in the vicinity of the second end 112, 212, by means of a screw 150, 250, with a countersunk region 118, 218 being provided in the mounting section 110, 210, into which region the head of the screw 150, 250 is countersunk when the screw 150, 250 is tightened and the toggle lever is therefore in a locking position.

In the embodiment according to FIG. 1, the complementary structures 140, 141, 142 and 143, 144, 145 are openings having an essentially circular cross-section, which are introduced into the attachment tab 122 or into the bent region 132. Other cross-sectional shapes, for example oval, are conceivable, and can ensure tolerance equalization. In the embodiment according to FIG. 2, the complementary structures 240, 241, 242 and 243, 244, 245 are approximately semi-circular recesses, which are open toward the free edge of attachment tab 222 or bent region 232.

Figure 3:
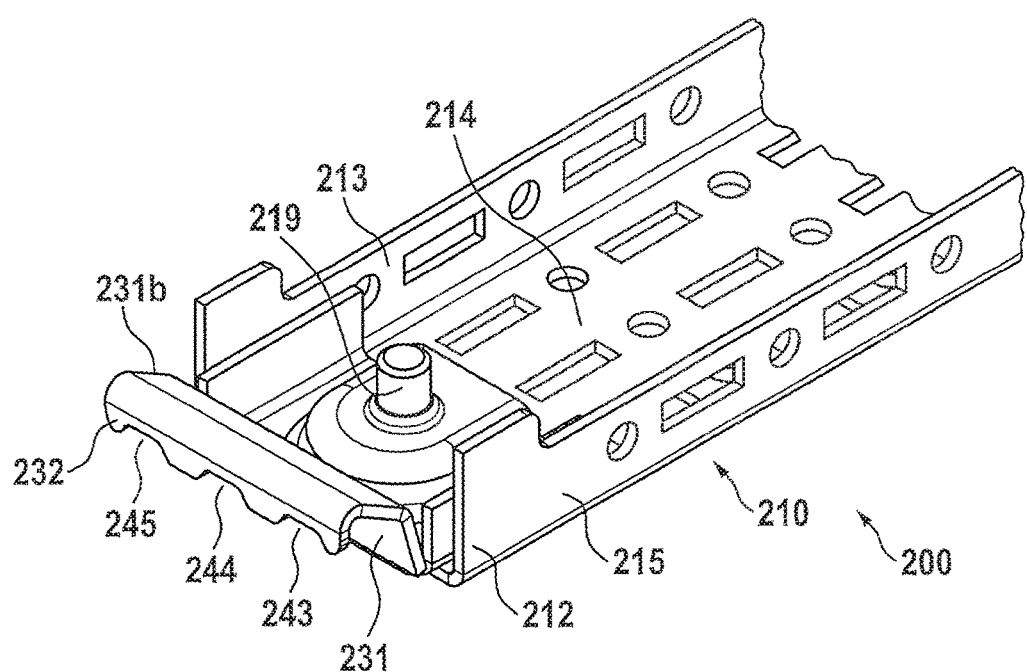
FIG. 3 shows a perspective detail view of an end of the mounting rail in a position rotated by 180° relative to FIG. 2.

FIG. 3 shows the mounting rail 200 from FIG. 2 in a position rotated by 180°, in the region of the second end 212. The toggle lever 231 is fixed in place on the mounting section 210, on its attachment side (see FIG. 4), by means of a screw, with a threaded sleeve 219 being affixed to the mounting section 210, which sleeve accommodates the thread of the screw 250 (FIG. 2). The attachment side makes a transition, by way of multiple bends, into the tensioning side 231b and, in particular, into the bent region 232, in which the recesses 243, 244, 245 lie. In the tensioned state of the toggle lever 231, the bent region 232 runs parallel to the attachment tab 222 of the supporting section 220 (FIG. 2).

Figure 4:
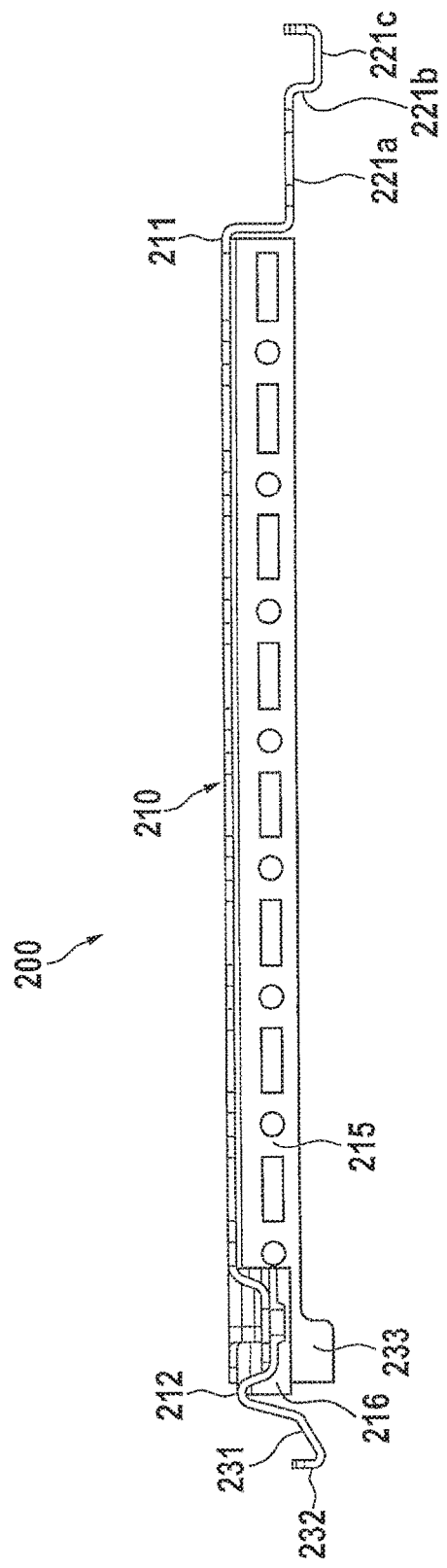
FIG. 4 shows a longitudinal section of the mounting rail from FIG. 2.

FIG. 4 shows a longitudinal section view of the mounting rail 200 from FIG. 2. At the second end 212 of the mounting section 210, an upward-projecting edge section 216 is provided, which defines a pivot axis for the toggle lever 231. In the released state of the toggle lever 231, in other words when the screw 250 (FIG. 2) is not tightened, the bent region 232 can be pivoted back, so to speak, so that a free space relative to an inner wall of a cabinet housing can be produced, which space can be used for mounting purposes. The tensioning section 230 is therefore movable, just like in the embodiment according to FIG. 1, while the supporting section 220 at the opposite first end 211 of the mounting section 210 is rigid. It can be seen there that a step is formed by the transition crosspiece 221b that follows the section 221a at a right angle, which step is equalized at the second end 212 by a corresponding projection 233 at the lower edge of the side 213 (not shown) or 215.

Figure 5:
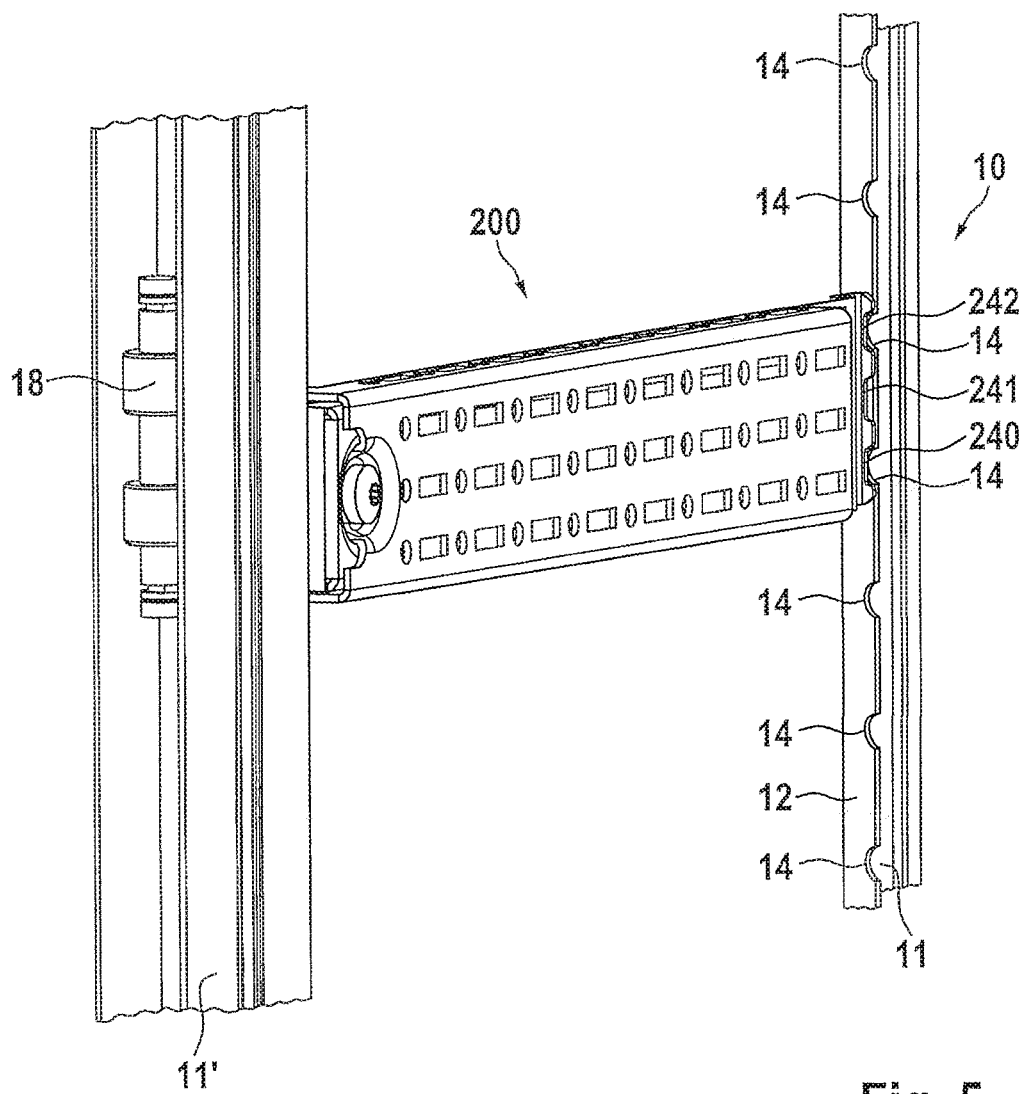
FIG. 5 shows a perspective view of a mounting rail according to FIG. 2, installed in a cabinet housing.

FIG. 5 shows a cabinet housing 10 in a detail, with inner sides 12 being indicated, which are provided on corresponding sides of the cabinet housing 10. The inner sides 12 have a number of cams 14 spaced at equal intervals, which are therefore provided in a raster on the inner side 12 of the side wall. A similar configuration is provided opposite the side 12, but this cannot be seen in the drawing. A mounting rail 200 is mounted between the side walls 11, 11', as described in FIGS. 2 to 4. In particular, two cams 14 are enclosed by recesses 240, 242, while the recess 241 remains unoccupied. On the side wall 11', the mounting rail 200 is fixed in place using the toggle lever 231 (FIGS. 2, 3, 4). Furthermore, a hinge 18 is affixed on the side wall 11'.

Figure 6:
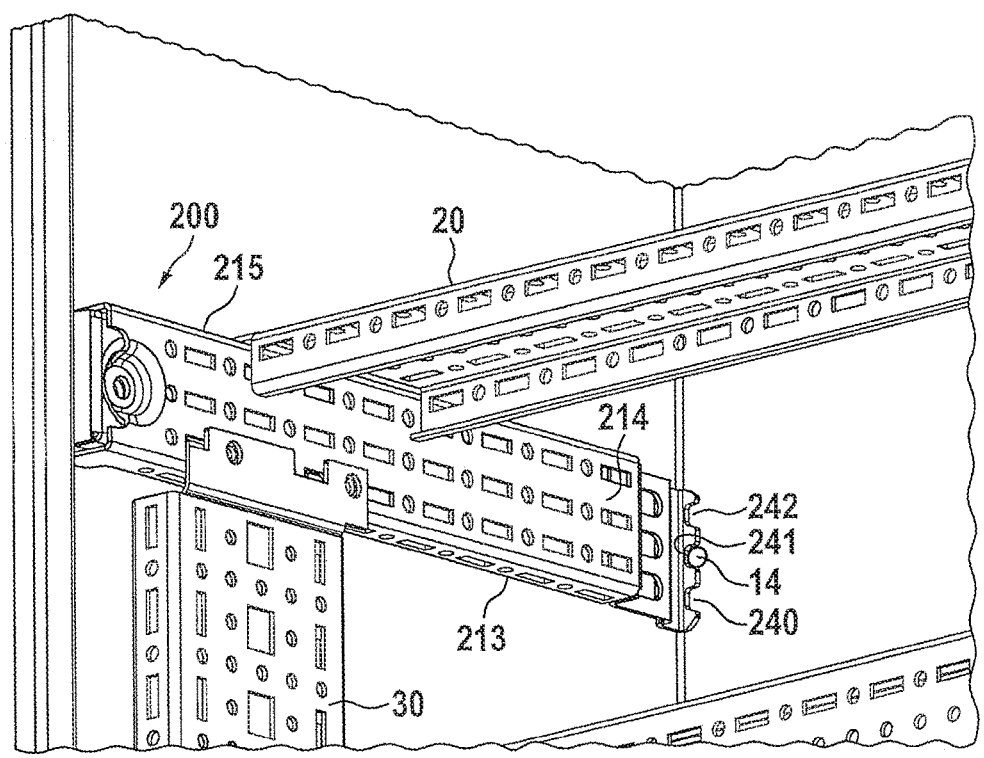
FIG. 6 shows a perspective view of the cabinet housing interior, with a mounting rail according to FIG. 2 being used in combination with a chassis.

FIG. 6 shows how a mounting rail 200 is used in order to undertake further installations in the interior of a cabinet housing 10. Since all the sides 213, 214, 215 of the mounting rail or of the mounting section 210 of the mounting rail are provided with a perforation system, multiple connection possibilities for the chassis 20, 30 arise. In the assembly process shown here, only one cam 14 is used to fix the mounting rail 200 of the supporting section 220 in place, while the recesses 240, 242 remain clear.

Figure 7:
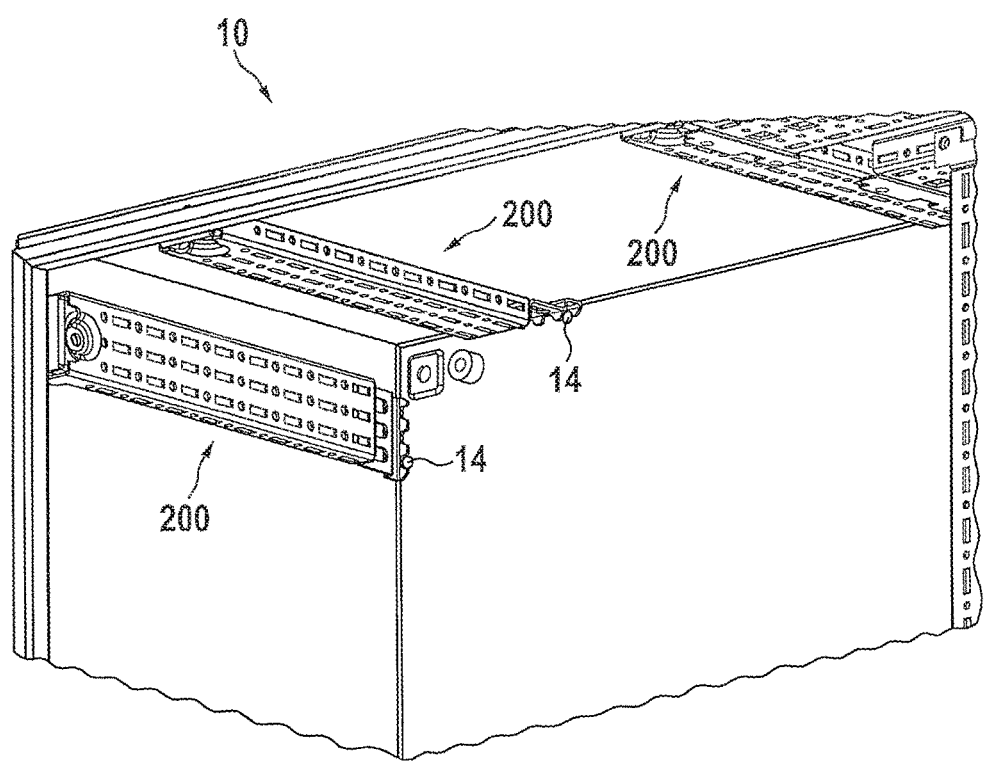
FIG. 7 shows a schematic representation of a cabinet housing, which shows different installation possibilities of a mounting rail.

FIG. 7 shows variants for affixing a mounting rail 200 a cabinet housing 10. The mounting rail 200 can not only be disposed to span the space between two side walls, but rather can also be disposed in the ceiling region, if necessary. In both of the mounting positions, only one of the recesses of a mounting rail can be laid over a cam, in each instance. By means of the raster positioning of the recesses 240, 241, 242 or 243, 244, 245 and the raster positioning of the cams 14, varied possibilities for fixing the mounting rail 200 in place (the same also holds true for the mounting rail 100 according to FIG. 1) on the cabinet housing 10 occur, because not necessarily every recess needs to be brought into coverage with a cam or another geometric structure, in order to ensure stable attachment of the mounting rail 100 or 200 on or in the cabinet housing 10. In particular, a height adjustment or height equalization can take place, which allows outfitting the cabinet housing with usual standard components. At a raster distance of 2.5 cm, for example, at the openings 140, 141, 142 and 143, 144, 145 or the recesses 240, 241, 242 and 243, 244, 245, height equalization of up to 5 cm can take place if fixing the respective component in place is undertaken by way of correspondingly selected cams 14 of the cabinet housing 10.

Figure 8:
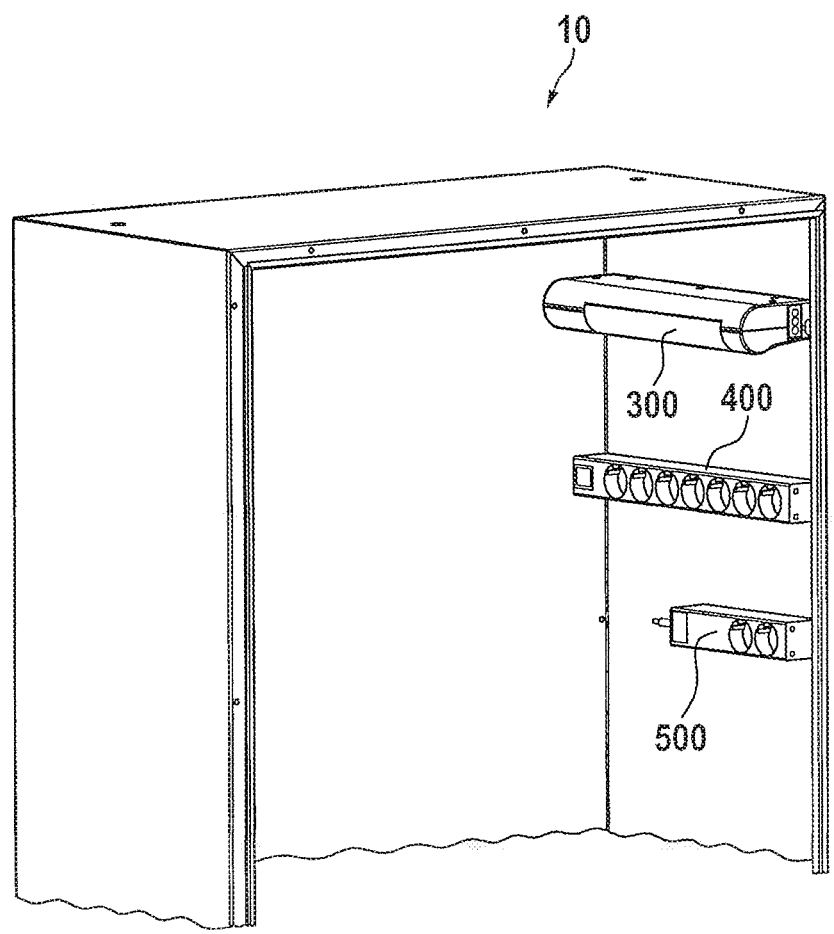
FIG. 8 shows a schematic representation of a cabinet housing with a light and electrical outlet strips as components of the interior fittings.

FIG. 8 shows a perspective view of a cabinet housing 10, in which a light 300, a first electrical outlet strip 400, and a second electrical outlet strip 500 are shown as components for the interior fittings, installed in any desired arrangement. The light 300 and the first electrical outlet strip 400 can be provided with supporting sections and tensioning sections, as they have been described in connection with FIGS. 1 and 2 for the mounting rails 100, 200 shown there. Other affixation possibilities are also conceivable; for example, the rather sensitive lights 300 can be suspended on projections behind which they engage, so that affixation takes place only with a form-fitting connection, but without or only with slight mechanical tension. For the second electrical outlet strip 500, only one-sided affixation on the housing is provided; here, too, projections behind which engagement takes place are practical as geometrical structures.

The characteristics of the disclosure disclosed in the above specification, in the drawings, and in the claims can be essential to implementation of the disclosure both individually and in any desired combination.

The invention claimed is:
1. A cabinet system comprising:
a cabinet housing;
at least one component for interior fittings having a mounting section that has a first end and a second end spaced apart from the first end, the component is installed and held on the cabinet housing with a form-fitting connection and under mechanical tension by a supporting section at the first end and a tensioning section at the second end; and
mounts formed on an interior of at least one of walls, a floor, and a ceiling of the cabinet housing, the mounts are in engagement with structures that are at least partially complementary and located on at least one of the first end and the second end of the component;
wherein the at least partially complementary structures are on the supporting section and on the tensioning section; and
wherein the tensioning section includes a toggle lever having an attachment side and a tensioning side, and the toggle lever is releasably screwed onto the mounting section on the attachment side.

2. The cabinet system according to claim 1, wherein the component for the interior fittings is a mounting rail, a support rail, a light or an electrical outlet strip.

3. The cabinet system according to claim 1, wherein the mounts of the cabinet housing are aligned with one another and spaced apart at equal intervals.

4. The cabinet system according to claim 1, wherein the supporting section has a transition crosspiece that proceeds from the mounting section and has an attachment tab that is bent away from the latter and runs essentially perpendicular to the sides of the mounting section, wherein the complementary structures are introduced into the attachment tab.

5. The cabinet system according to claim 4, wherein a first section of the transition crosspiece extends in the longitudinal direction of the mounting section.

6. The cabinet system according to claim 1, wherein the second end of the mounting section has an edge section on which the toggle lever rests so as to pivot.

7. The cabinet system according to claim 1, wherein the at least partially complementary structures are configured in the tensioning side of the toggle lever.

8. The cabinet system according to claim 1, wherein the at least partially complementary structures are perforations, wherein a number of the perforations is provided in an attachment tab of the supporting section, and a number of the perforations is provided in the tensioning section of a mounting rail.

9. The cabinet system according to claim 1, wherein the at least partially complementary structures are cutouts that are open toward a free edge of the attachment tab or toward the free edge of a bent region on the tensioning side of the toggle lever.

10. The cabinet system according to claim 1, wherein the sides of the mounting section are provided with a perforation system.

11. The cabinet system according to claim 1, wherein the mounting section is U-shaped in cross-section.

12. The cabinet system of claim 1, further comprising an edge over which the toggle lever extends, the edge defines a pivot axis for the toggle lever.

13. The cabinet system of claim 1, wherein the edge is an upward-projecting edge section at the second end of the mounting section.

14. The cabinet system of claim 1, wherein the mounts protrude from the interior of at least one of the walls, floor, and ceiling of the cabinet housing.

15. A cabinet system comprising:
a cabinet housing including mounts formed on an interior of at least one of walls, a floor, and a ceiling of the cabinet housing; and
a component removably mounted to the mounts, the component including:
a mounting section having a first end spaced apart from a second end;
a supporting section at the first end;
a tensioning section at the second end, the tensioning section including a toggle lever that is releasably screwed onto the mounting section, the toggle lever extends over an edge section of the mounting section, the edge section provides a pivot axis for the toggle lever; and
engagement members at the supporting section and the toggle lever of the tensioning section, the engagement members are sized and shaped to cooperate with the mounts of the cabinet housing to mount the component within the housing;

wherein actuation of the toggle lever moves the engagement members of the toggle lever into and out of engagement with the mounts of the cabinet housing to removably couple the component to the mounts.

16. The cabinet system of claim 15, wherein the edge section is an upward-projecting edge section.

17. The cabinet system of claim 15, wherein the mounts of the cabinet housing protrude from the interior of the cabinet housing.

* * * * *